(12) United States Patent
Hatori et al.

(10) Patent No.: US 9,871,347 B2
(45) Date of Patent: Jan. 16, 2018

(54) SEMICONDUCTOR LIGHT EMITTING DEVICE AND OPTICAL TRANSCEIVER

(71) Applicants: FUJITSU LIMITED, Kawasaki-shi, Kanagawa (JP); NEC Corporation, Minato-ku, Tokyo (JP); The University of Tokyo, Bunkyo-ku, Tokyo (JP)

(72) Inventors: Nobuaki Hatori, Tsukuba (JP); Masashige Ishizaka, Minato (JP); Takanori Shimizu, Minato (JP); Yasuhiko Arakawa, Bunkyo (JP); Satoshi Iwamoto, Bunkyo (JP); Katsuaki Tanabe, Bunkyo (JP)

(73) Assignees: FUJITSU LIMITED, Kawasaki (JP); NEC CORPORATION, Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 15/281,426

(22) Filed: Sep. 30, 2016

(65) Prior Publication Data
US 2017/0098922 A1    Apr. 6, 2017

(30) Foreign Application Priority Data
Oct. 1, 2015   (JP) ................ 2015-196119

(51) Int. Cl.
*G02B 6/122*   (2006.01)
*H01S 5/20*    (2006.01)
(Continued)

(52) U.S. Cl.
CPC ............ *H01S 5/2027* (2013.01); *H01S 5/026* (2013.01); *H01S 5/1014* (2013.01);
(Continued)

(58) Field of Classification Search
USPC .................................................. 385/14, 126
See application file for complete search history.

(56) References Cited

U.S. PATENT DOCUMENTS

2008/0273829 A1* 11/2008 Saida ................. G02B 6/12011
    385/14
2011/0150018 A1* 6/2011 Park ...................... B82Y 20/00
    372/45.01

OTHER PUBLICATIONS

S. Keyvaninia, et al.; "Demonstration of a heterogeneously integrated III-V/SOI single wavelength tunable laser;" Optics Express; vol. 21; No. 3; Feb. 11, 2013; pp. 3784-3792 (9 Sheets).
(Continued)

*Primary Examiner* — Eric Wong
(74) *Attorney, Agent, or Firm* — Kratz, Quintos & Hanson, LLP

(57) ABSTRACT

A semiconductor light source includes a substrate, an optical waveguide having a reflection structure provided on the substrate with an oxide film in between and a semiconductor light emitting element provided on the optical waveguide. The optical waveguide includes a constant width core layer portion located in a center portion, tapered core layer portions that are provided on either side of the constant width core layer and of which the core width gradually increases and a constant width core layer portion for an optical wire waveguide. The semiconductor light emitting element is placed so as to cover at least a portion of the tapered core layer portions on both sides.

13 Claims, 16 Drawing Sheets

(51) Int. Cl.
| | |
|---|---|
| H01S 5/10 | (2006.01) |
| H01S 5/12 | (2006.01) |
| H04B 10/40 | (2013.01) |
| H04B 10/50 | (2013.01) |
| H04B 10/516 | (2013.01) |
| H01S 5/026 | (2006.01) |
| H01S 5/125 | (2006.01) |
| H01S 5/00 | (2006.01) |
| H01S 5/02 | (2006.01) |
| H01S 5/022 | (2006.01) |
| H01S 5/042 | (2006.01) |
| H01S 5/14 | (2006.01) |
| H01S 5/34 | (2006.01) |

(52) U.S. Cl.
CPC .............. *H01S 5/1032* (2013.01); *H01S 5/12* (2013.01); *H01S 5/124* (2013.01); *H01S 5/125* (2013.01); *H01S 5/1237* (2013.01); *H04B 10/40* (2013.01); *H04B 10/501* (2013.01); *H04B 10/516* (2013.01); *H01S 5/0085* (2013.01); *H01S 5/021* (2013.01); *H01S 5/02276* (2013.01); *H01S 5/0425* (2013.01); *H01S 5/141* (2013.01); *H01S 5/3412* (2013.01)

(56) References Cited

OTHER PUBLICATIONS

A. Fang, et al.; "Single Wavelength Silicon Evanescent Lasers;" IEEE Journal of Selected Topics in Quantum Electronics; vol. 15; No. 3; May/Jun. 2009; pp. 535-544 (10 Sheets).

K. Tanabe, et al.; "1.3 μm InAs/GaAs quantum dot lasers on Si rib structures with current injection across direct-bonded GaAs/Si heterointerfaces;" Optics Express; vol. 20; No. 26; pp. B315-B321 (7 Sheets).

\* cited by examiner

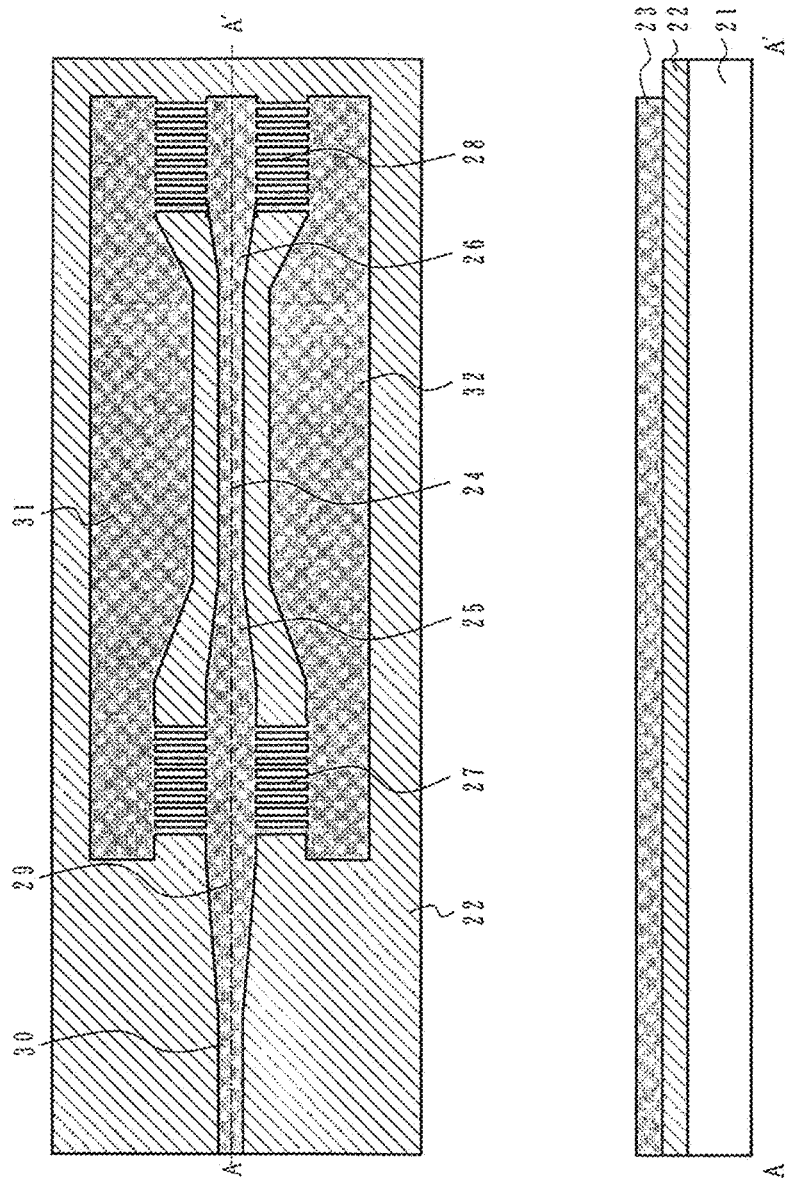

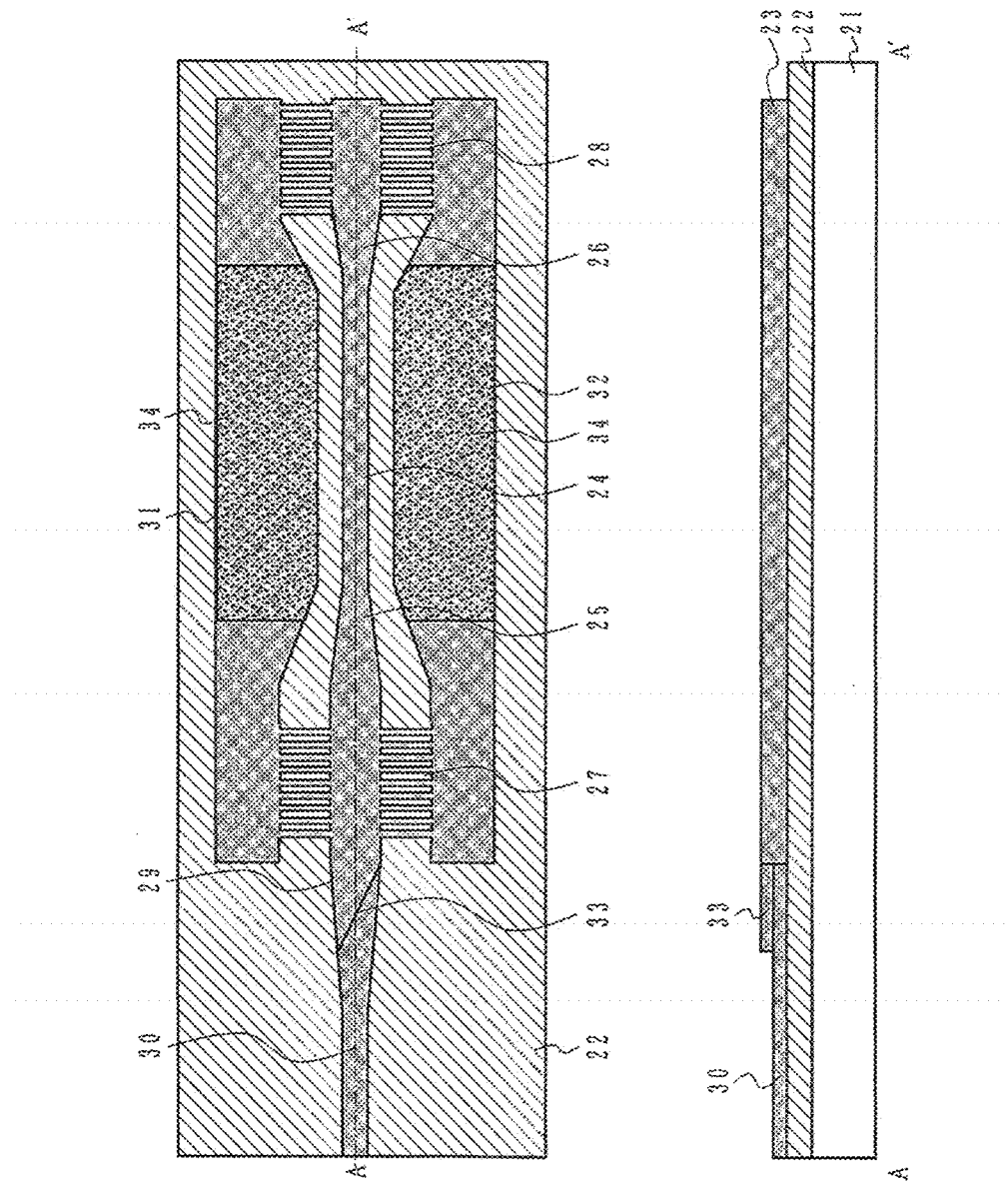

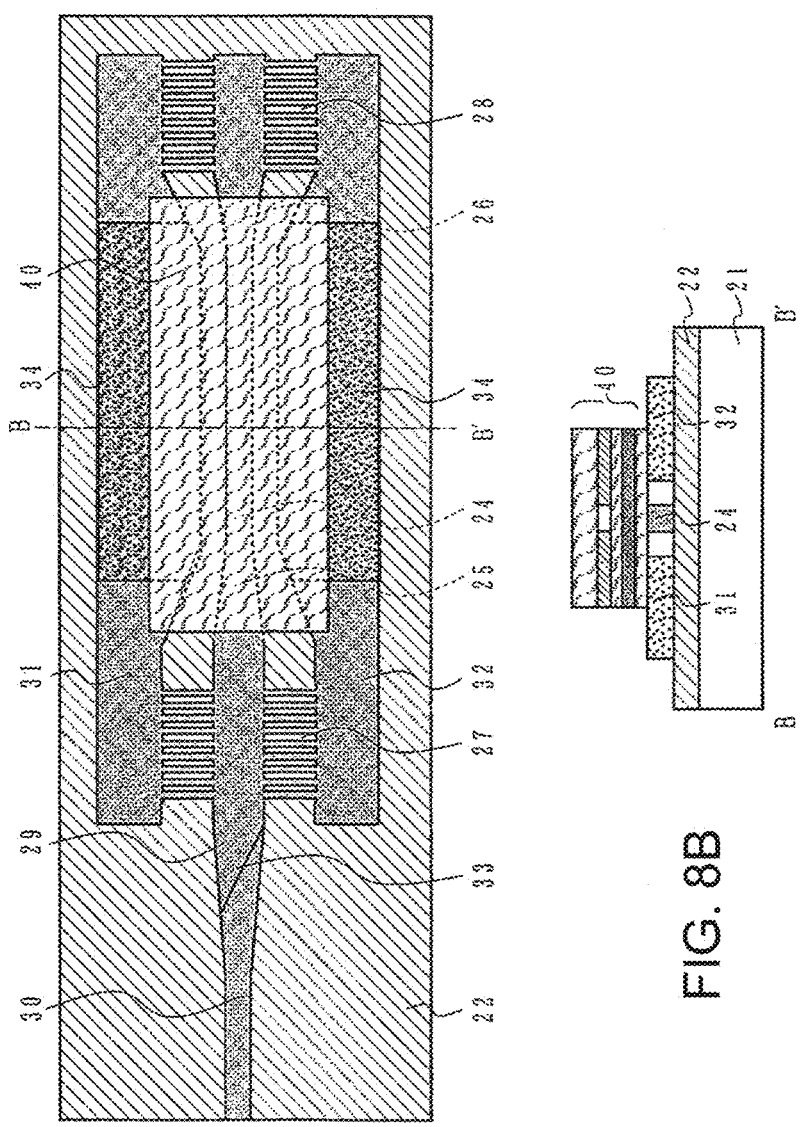

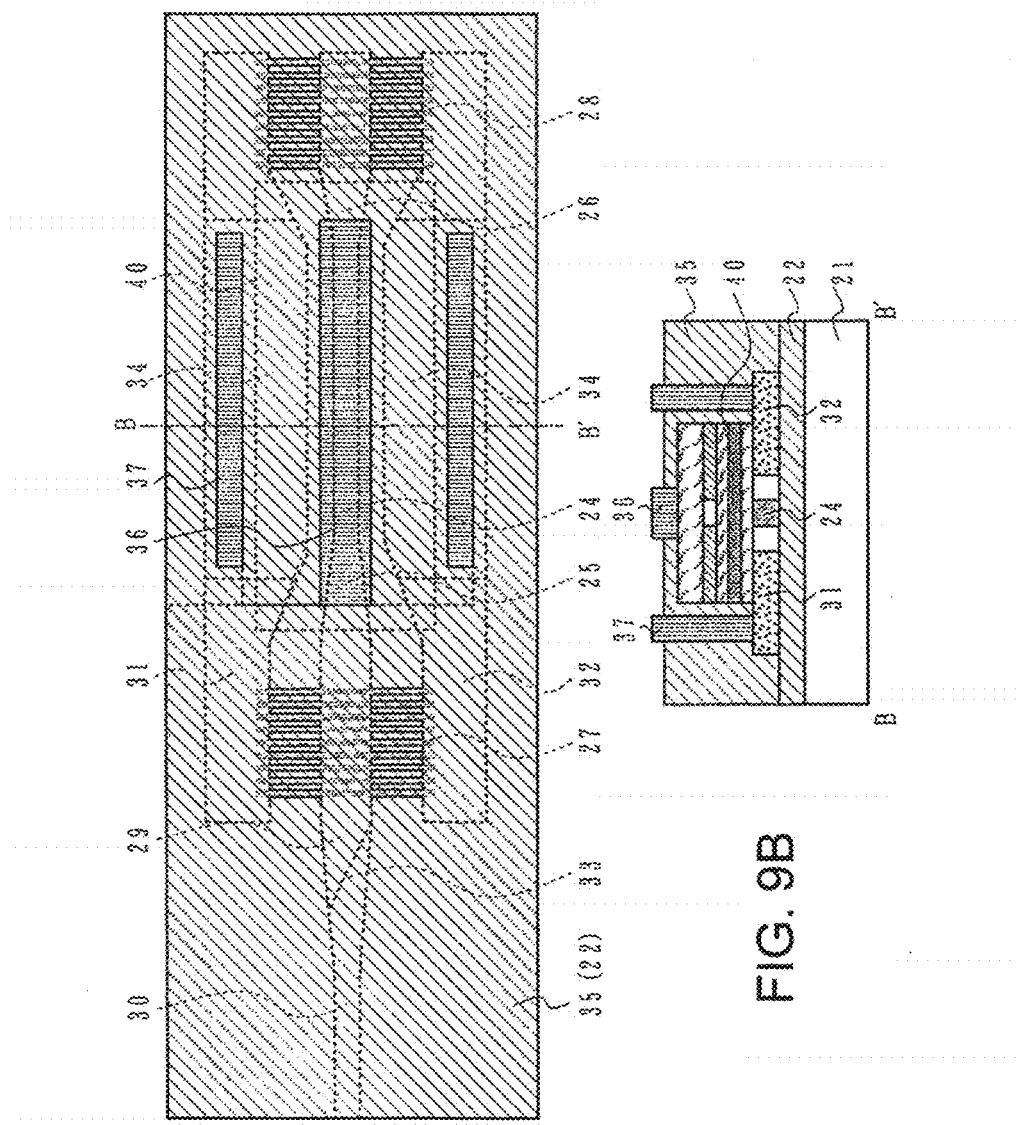

SEMICONDUCTOR LIGHT EMITTING DEVICE AND OPTICAL TRANSCEIVER

CROSS-REFERENCE TO RELATED APPLICATION

This application is based upon and claims the benefit of priority of the prior Japanese Patent Application No. 2015-196119, filed on Oct. 1, 2015, the entire contents of which are incorporated herein by reference.

FIELD

The present invention relates to a semiconductor light emitting device and an optical transceiver, and, for example, relates to a light source used for an optical interconnect using optical wire waveguides on Si substrates such as optical wire waveguides between boards, between chips or within a chip, or for an optical fiber communication using optical fibers.

BACKGROUND

In order to break the limit of electrical wires in LSIs (large scale integrated circuits) in terms of the high speed operation, signal communication between chips at a higher speed has been attempted by forming an optical circuit on an Si substrate. An optical circuit consists of optical elements such as an optical modulator that modulates an input signal, an optical receiver that receives a light signal, and optical function elements such as a splitter that splits light.

Light is inputted to these optical function elements via an optical waveguide that propagates a light signal. In addition, light enters the optical circuit from the outside, or light enters the optical circuit from a light source formed on the Si substrate.

In order to make the miniaturization of optical circuit elements easier, it is better to form a light source on an Si substrate than allow light to enter through an optical fiber. In order to realize a light source on an Si substrate, technologies such as direct growth, flip-chip bonding and wafer bonding are available. Fabrication using a technology for bonding substrates together is characterized by such advantages as mass production and the integration of multiple function elements, and thus, is developing.

For example, it has been proposed to bond an active layer made of a III-V compound semiconductor onto an Si substrate using SiOx (see Non-Patent Document 1). In this proposal, the active region made of the III-V compound semiconductor and the Si waveguide are provided as tapered waveguides so that the spot size is widened in order to allow light to transit efficiently from the active region made of the III-V compound semiconductor to the Si waveguide.

It has also been proposed to bond an active layer made of a III-V compound semiconductor onto an Si substrate through wafer bonding (see Non-Patent Document 2). In this proposal, the transition from the active region made of the III-V compound semiconductor to the Si waveguide takes place by providing a tapered waveguide on the active region side made of the III-V compound semiconductor to widen the spot size. In addition, a reflection structure is provided on the Si waveguide side.

Meanwhile, it has been proposed to bond a quantum dot laser having excellent high temperature properties as a light source (see Non-Patent Document 3). In this proposal, a quantum dot laser is bonded through wafer bonding, and its operation as a light source on an Si substrate is confirmed.

CITATION LIST

Non-Patent Literature

Non-Patent Literature 1: Optics Express, Vol. 21, No. 3, pp. 3784-3792, 2013

Non-Patent Literature 2: IEEE Journal of Selected Topics in Quantum Electronics, Vol. 15, No. 3, pp. 535-544, 2009

Non-Patent Literature 3: Optics Express, Vol. 20, No. 26, pp. B315-B321, 2012

SUMMARY

A problem arises with the proposal in Non-Patent Document 3 such that light emitted from the quantum dot laser is not guided into the rib structure formed on the Si substrate. This occurs because a tapered waveguide is not formed on the Si waveguide side, unlike in Non-Patent Document 1 and Non-Patent Document 2. It is desired to input light from a quantum dot laser, which is expected to operate at a high temperature, into an Si waveguide easily and efficiently.

However, such a problem arises with the introduction to the waveguide of a tapered structure on the light emitting side, in the same manner as in Non-Patent Document 1 and Non-Patent Document 2, in that there is difficulty with precise positioning and the process is complicated, which leads to an increase in the cost.

One aspect of the disclosure provides a semiconductor light source, including:
  a substrate;
  an optical waveguide having a reflection structure provided on the substrate with an oxide film between the optical waveguide and the substrate; and
  a semiconductor light emitting element provided on the optical waveguide, wherein
  the optical waveguide includes: a constant width core layer portion located in a center portion; tapered core layer portions that are provided on either side of the constant width core layer and of which the core width gradually increases; and a constant width core layer portion for an optical wire waveguide, and
  the semiconductor light emitting element is placed so as to cover at least a portion of the tapered core layer portions on both sides.

Another aspect of the disclosure provides an optical transceiver on the above-described substrate on which the above-described semiconductor light source is provided, where the optical transceiver is provided with: an optical modulator; a core layer portion for an input waveguide for connecting the above-described core layer portion for an optical wire waveguide to the above-described optical modulator; an optical wire waveguide core layer portion for input; and a Ge-based light receiving element that is optically coupled with the above-described optical wire waveguide core layer portion for input and that is made of Ge or of which the major component is Ge.

The disclosed semiconductor light source and optical transceiver make it possible to efficiently propagate light from a semiconductor light emitting element into a semiconductor optical waveguide with a simple structure.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 5A and 5B are diagrams illustrating the semiconductor light source according to Example 1 of the present invention in the middle of the manufacturing process;

FIGS. 7A and 7B are diagrams illustrating the semiconductor light source according to Example 1 of the present invention in the middle of the manufacturing process after the state in FIGS. 6A and 6B;

FIGS. 8A and 8B are diagrams illustrating the semiconductor light source according to Example 1 of the present invention in the middle of the manufacturing process after the state in FIGS. 7A and 7B;

FIGS. 9A and 9B are diagrams illustrating the semiconductor light source according to Example 1 of the present invention after the state in FIGS. 8A and 8B;

DESCRIPTION OF EMBODIMENTS

Figure 1:
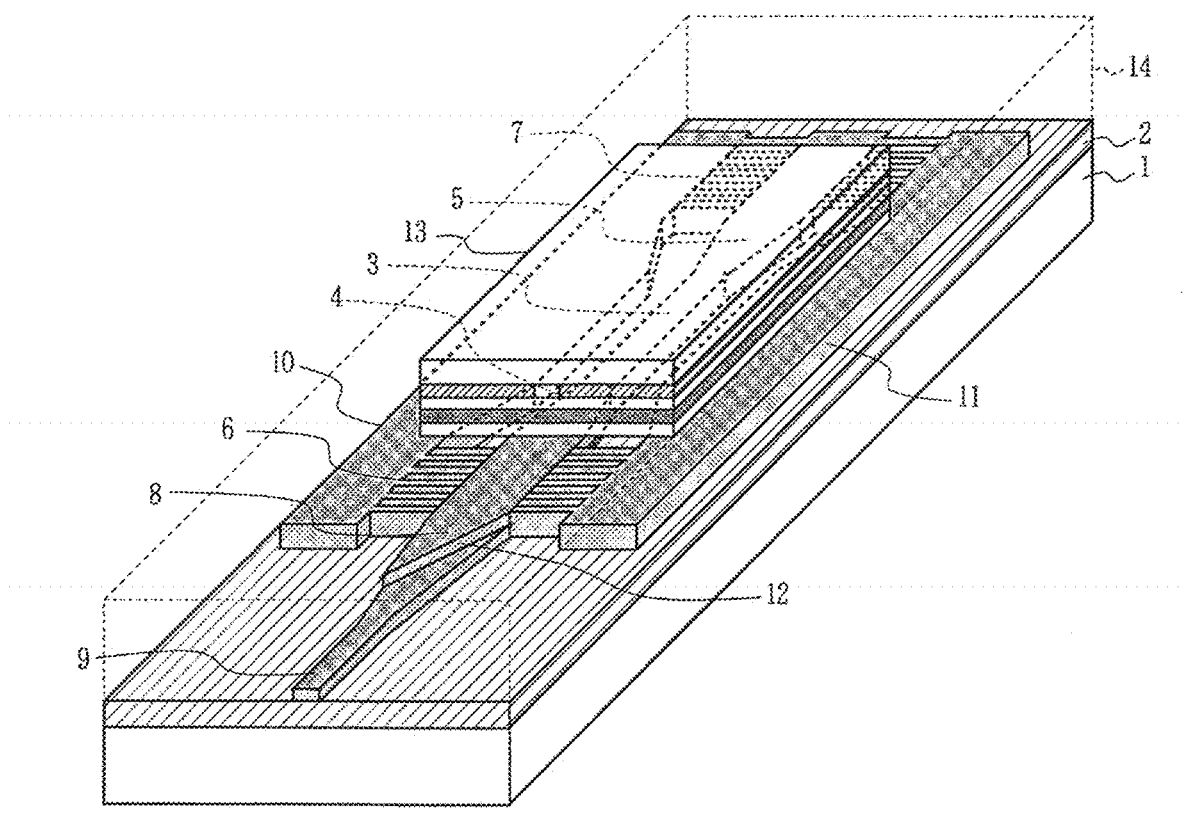
FIG. 1 is a schematic perspective diagram illustrating a semiconductor light source according to an embodiment of the present invention.
Figure 2A:
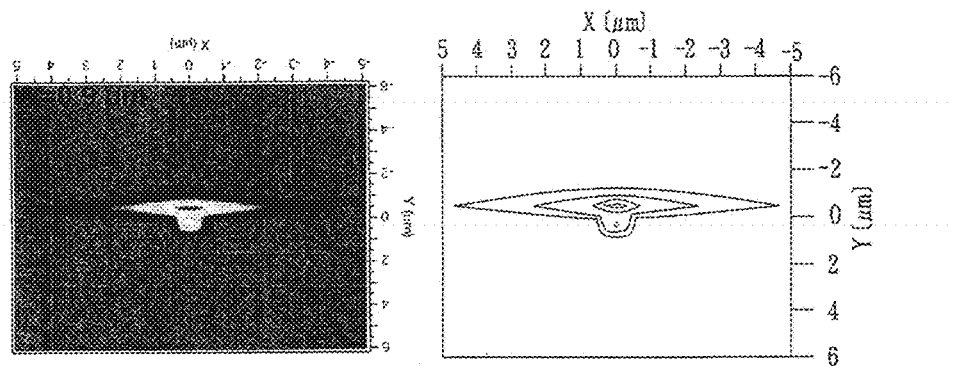
FIGS. 2A through 2C are diagrams illustrating the transition states of propagation light in the semiconductor light source according to the embodiment of the present invention.
Figure 2B:
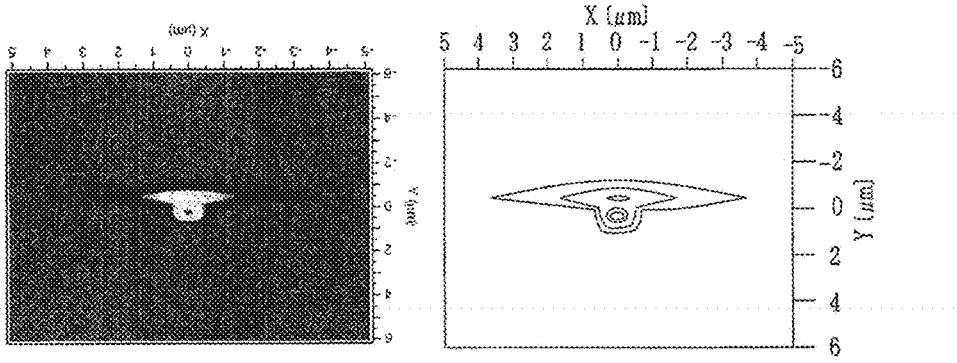
Figure 2C:
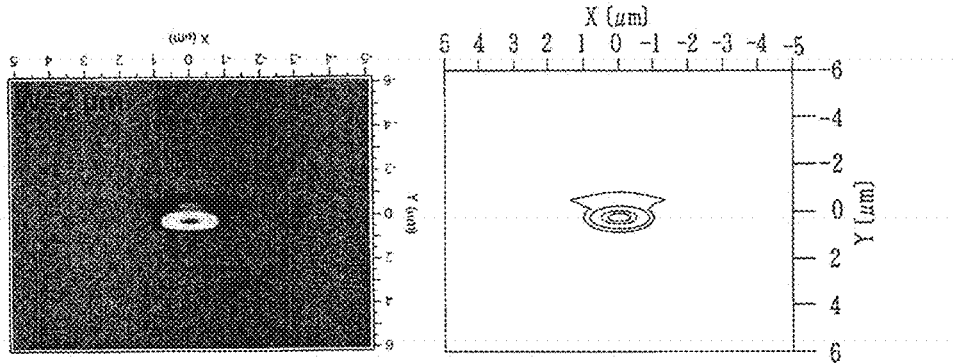

The semiconductor light source according to an embodiment of the present invention is described in reference to FIGS. 1 through 2C. FIG. 1 is a schematic perspective diagram illustrating the semiconductor light source according to the embodiment of the present invention, where an optical waveguide having a reflection structure is provided on a substrate 1 with an oxide film 2 in between, and a semiconductor light emitting element 13 is provided on the optical waveguide so as to optically couple the optical waveguide to the semiconductor light emitting element 13. In addition, an insulating film such as an oxide film that becomes an upper clad layer 14 is provided on the entire surface.

The optical waveguide has a constant width core layer portion 3 that is located in the center portion, tapered core layer portions 4 and 5 of which the width gradually increases and that are provided on the two sides of the constant width core layer portion 3, and a core layer portion 9 for an optical wire waveguide with a constant width. The semiconductor light emitting element 13 is provided so as to cover at least a portion of the tapered core layer portions 4 and 5 on both sides.

As illustrated in FIG. 1, the reflection structure may be a distributed Bragg reflection mirror made of side diffraction gratings 6 and 7 formed in the regions that are not covered by the semiconductor light emitting element 13. In this case, it is desirable for the reflectance of the side diffraction grating 7 formed in the rear to be higher than the reflectance of the side diffraction grating 6 in the front. Alternatively, a side diffraction grating 6 may be provided only in a region that is not covered by the semiconductor light emitting element 13 on the side the light is emitted from, and a loop mirror may be provided in a region that is not covered by the semiconductor light emitting element 13 on the side that is opposite to the side the light is emitted from. Alternatively, the reflection structure may be a resonator made of a pair of loop mirrors provided on both ends of the optical waveguide. In this case, a core layer portion for an optical wire waveguide with a constant width is branched from the input waveguide of the loop mirror on the light emitting end sides.

In addition, the reflection structure may be a distributed feedback resonator made of a side diffraction grating provided on a side of the constant width core layer portion 3 located in the center portion. At this time, a phase shift region where the phase shifts by ¼ of the oscillation wavelength λ of the semiconductor light emitting element 13 may be provided to the side diffraction grating in order to increase the single wavelength oscillation properties.

Furthermore, an inversely tapered core layer portion 8 of which the width gradually decreases toward the core layer portion 9 for an optical wire waveguide may be provided between the core layer portion 9 for an optical wire waveguide and the tapered core layer portion 4 on the light emitting side in order to guide a wave smoothly to the core layer portion 9 for an optical wire waveguide. At this time, it is desirable to provide a transition portion 12 of which the thickness varies to the inversely tapered core layer portion 8 in order to reduce the reflection of the guided light. In the transition portion 12, the film thickness may vary in stepwise in the direction diagonal to a guided wave direction, or the film thickness may gradually decrease in the direction diagonal to a guided wave direction.

FIGS. 2A through 2C are diagrams illustrating the transition state of propagation light in the semiconductor light source according to an embodiment of the present invention, where the optical axis of the optical waveguide is located at point 0 along the lateral axis, which is the X axis, and the light intensity distribution in the semiconductor light emitting element 13 is represented by the points of which the Y value is − along the longitudinal axis, and the light intensity distribution in the optical waveguide is represented by the points of which the Y value is + along the longitudinal axis. FIG. 2A illustrates the light intensity distribution in the center portion of the gain region provided in the constant width core layer portion 3 having a width of 0.9 µm. FIG. 2B illustrates the light intensity distribution in the location in the end portion of the gain region where the width of the tapered core layer portion 4 is 1.0 µm. FIG. 2C illustrates the light intensity distribution at the output end of the tapered core layer portion 4 of which the width has been widened to 2.0 µm. Here, the left side of each diagram illustrates the simulation results, and the right side is a reproduced illustration of the left side.

The refractive index of the core layer portion is high for the light generated in the semiconductor light emitting element 13 because the width of the core layer portion is increased in the end portion of the gain region, and thus, the light transits into the core layer portion. As illustrated in FIG. 2A, the light is confined inside the light emitting element in the center portion of the semiconductor light emitting element 13. However, it can be seen from FIG. 2C that the light transits into the core layer in the portion where the width of the core layer becomes 2.0 µm.

In the case of FIG. 1, the light that has transited into the core layer is reflected back to the core layer from reflection mirrors formed of the side diffraction gratings 6 and 7 so that laser oscillation occurs in the resonator defined by the side diffraction gratings 6 and 7. Part of the light that has transmitted without being reflected from the reflection region where the side diffraction grating 6 is provided in the front enters into the transition portion 12 of which the thickness varies. In the transition portion 12, the thickness of the core layer varies in such a manner that the light that has propagated through the tapered core layer portions 4 and 5 and the constant width core layer portion 3 having a thickness of 700 nm, for example, can propagate through the core layer portion 9 for an optical wire waveguide having a thickness of 220 nm. In addition, the inversely tapered core layer portion 8, where the width of the waveguide gradually changes, is provided so as to prevent excessive reflection from occurring within this region.

It is also desirable to provide pedestals 10 and 11, on which the semiconductor light element 13 is placed, on both sides of at least a portion of the optical waveguide so that the semiconductor light emitting element 13 can be mounted on the substrate 1 in accordance with a substrate bonding technology. In addition, the pedestals 10 and 11 can be doped with impurities of one conductivity type so that one of the electrodes of the semiconductor light emitting element 13 can be formed.

In the case where such a semiconductor light source is applied to Si photonics, an SOI substrate where a single crystal Si layer is provided on an Si substrate with a buried oxide film in between may be used so that the optical waveguide and the side diffraction gratings 6 and 7 can be formed by processing the single crystal Si layer in the SOI substrate. At this time, the buried oxide film becomes the oxide film 2 that works as the lower clad layer.

Though the semiconductor light emitting element 13 may be of any type as long as laser oscillation occurs when the side diffraction gratings 6 and 7 operate as a resonator, a quantum dot semiconductor laser having a quantum dot active layer of which the element properties are excellent at a high temperature is desirable.

In addition, an optical modulator is provided on the substrate 1 on which the above-described semiconductor light source is provided, and a core layer portion for an input waveguide is provided for connection between the core layer portion 9 for an optical wire waveguide and the optical modulator, and thus, an optical transmitter can be obtained. At this time, a number of combinations of a semiconductor light source and an optical modulator can be arranged in parallel so that an optical transmitter that can deal with wavelength division multiplexing communication can be provided. Here, an electrical field absorption type optical modulator may be used as the optical modulator, or a side diffraction grating type optical modulator may be used.

Furthermore, an optical wire waveguide core layer portion for input and a Ge-based light receiving element that is optically coupled with the optical wire waveguide core layer portion for input and that is made of Ge or has Ge as the major component are provided on the substrate 1 on which the above-described optical transmitter is provided, and thus, an optical transceiver can be obtained. At this time, a number of combinations of a semiconductor light source and an optical modulator can be arranged in parallel, and the same number of combinations of an optical wire waveguide core layer portion for input and a Ge-based light receiving element can be arranged in parallel so that an optical transceiver that can deal with wavelength division multiplexing communication can be provided.

In the embodiment of the present invention, a high precision process with a submicron unit is not necessary to fabricate the semiconductor light emitting element 13, which can be fabricated in a simple process. In addition, the light outputted from the semiconductor light emitting element 13 can be efficiently propagated into the optical waveguide formed on the substrate 1.

EXAMPLE 1

Figure 3:
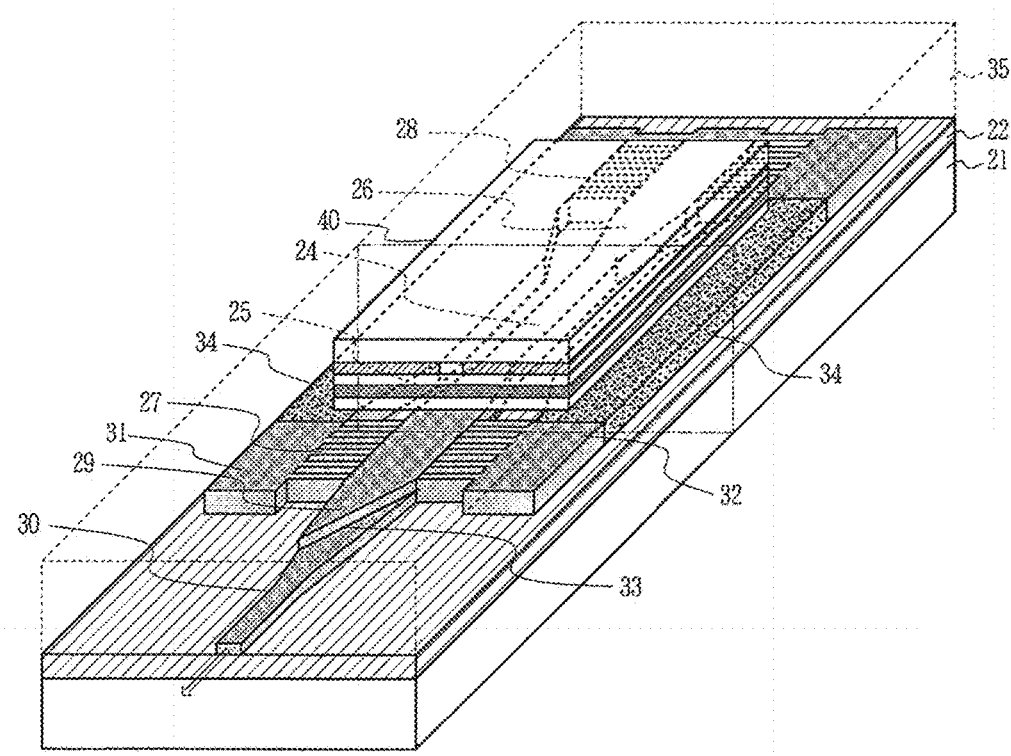
FIG. 3 is a schematic perspective diagram illustrating a semiconductor light source according to Example 1 of the present invention.
Figure 4:
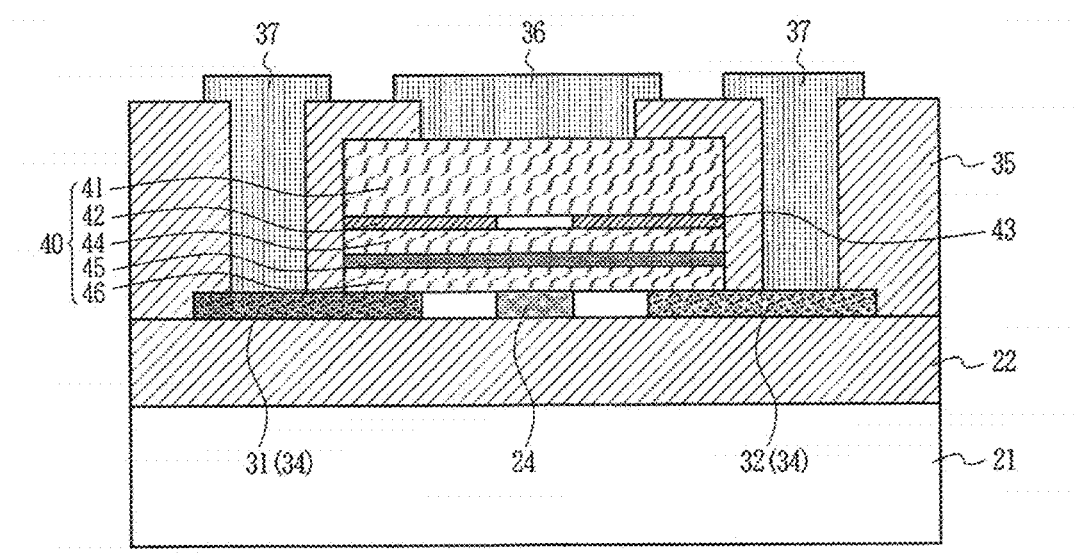
FIG. 4 is a schematic cross-sectional diagram along the single-dotted chain line in a rectangular shape in FIG. 3.

Next, the semiconductor light source according to Example 1 of the present invention is described in reference to FIGS. 3 through 9B. FIG. 3 is a schematic perspective diagram illustrating the semiconductor light source according to Example 1 of the present invention, and FIG. 4 is a schematic cross-sectional diagram along the single-dotted chain line in a rectangular shape in FIG. 3. Here, the semiconductor light source is fabricated using an SOI substrate where a single crystal Si layer 23 having a thickness of 700 nm is provided on an Si substrate 21 with a BOX layer 22 having a thickness of 3 µm. The BOX layer 22 works as a lower clad layer of an optical waveguide.

As illustrated in FIG. 3, the semiconductor light source according to Example 1 of the present invention is provided by processing the single crystal Si layer 23 provided on the Si substrate 21 with the BOX layer 22 in between so that an optical waveguide having side diffraction gratings can be formed and by fusing a quantum dot semiconductor laser 40 onto the optical waveguide in accordance with a substrate bonding technology. The optical waveguide has a constant width core layer portion 24 having a width of 0.9 µm that is located in the center portion, and a front tapered core layer portion 25 and a rear tapered core layer portion 26 of which the core width gradually increases from 0.9 µm to 2.0 µm that are placed on both sides of the constant width core layer portion 24. At this time, pedestals 31 and 32 are formed on both sides of the constant width core layer portion 24 in the direction in which the constant width core layer portion 24 extends, and the pedestals 31 and 32 are doped with P (phosphorous) so as to form n type semiconductor regions 34.

In addition, a front diffraction grating reflection mirror 27 and a rear diffraction grating reflection mirror 28 where a side diffraction grating is formed on a side of the core layer portion having a width of 2.0 µm are respectively provided at the other end of the front tapered core layer portion 25 and at the other end of the rear tapered core layer portion 26. The front diffraction grating reflection mirror 27 and the rear diffraction grating reflection mirror 28 form a distributed Bragg reflection mirror type resonator.

Furthermore, a core layer portion 30 for an optical wire waveguide having a thickness of 220 nm and a width of 450 nm is provided on the output end side, and an inversely tapered core layer portion 29 of which the width varies from 2.0 μm to 450 nm is provided between the core layer portion 30 for an optical wire waveguide and the front diffraction grating reflection mirror 27. The inversely tapered core layer portion 29 is provided with a diagonal step portion 33 of which the thickness varies in stepwise from 700 nm to 220 nm in the direction diagonal to the optical axis.

FIG. 4 is a schematic cross-sectional diagram along the single-dotted chain line in a rectangular shape in FIG. 3 where the pedestals 31 (34) and 32 (34) are used to fuse the quantum dot semiconductor laser 40 so as not to overlap the front diffraction grating reflection mirror (27) and the rear diffraction grating reflection mirror (28) in accordance with a substrate bonding technology. Next, the entire surface is covered with an $SiO_2$ film 35 that works as a upper clad layer, and then, a p side electrode 36 is formed on the quantum dot semiconductor laser 40, and n side electrodes 37 are formed on the n type semiconductor regions 34.

The quantum dot semiconductor laser 40 is formed by sequentially growing the films of a p type $Al_{0.4}Ga_{0.6}As$ clad layer 41, a p type $Al_{0.98}Ga_{0.02}As$ layer 42, a p type $Al_{0.4}Ga_{0.6}As$ clad layer 44, a quantum dot active layer 45 in which InAs quantum dots are formed, and an n type $Al_{0.4}Ga_{0.6}As$ clad layer 46 having a thickness of 0.3 μm on a GaAs substrate (ground and polished, removed through etching). Next, an oxide film 43 of which the main composition is AlOx is formed through natural oxidation on the sides of the p type $Al_{0.98}Ga_{0.02}As$ layer 42 so as to provide a constricted structure where a current flows through only the p type $Al_{0.98}Ga_{0.02}As$ layer 42 that remains at the center.

Next, in reference to FIGS. 5A through 9B, the manufacturing process for the semiconductor light source according to Example 1 of the present invention is described. Here, FIGS. 5A, 6A, 7A, 8A and 9A are schematic plan diagrams, and FIGS. 5B, 6B, 7B, 8B and 9B are schematic cross-sectional diagrams along the single-dotted chain line in FIGS. 5A, 6A, 7A, 8A and 9A, respectively. First, a single crystal Si layer 23 having a thickness of 700 nm provided on an Si substrate 21 with a BOX layer 22 having a thickness of 3 μm in between is etched using an $SiO_2$ mask (not shown) so as to form an optical waveguide and pedestals 31 and 32. The optical waveguide has a constant width core layer portion 24 having a width of 0.9 μm located in the center portion, and a front tapered core layer portion 25 and a rear tapered core layer portion 26 that are provided on either side of the constant width core layer portion 24 and of which the core width gradually increases from 0.9 μm to 2.0 μm.

In addition, a front diffraction grating reflection mirror 27 and a rear diffraction grating reflection mirror 28, where side diffraction gratings are formed on the sides of the core layer portion having a width of 2.0 μm, are provided on the other end of the front tapered core layer portion 25 and the other end of the rear tapered core layer portion 26, respectively. Furthermore, a core layer portion 30 for an optical wire waveguide having a width of 450 nm is provided on the output end side, and an inversely tapered core layer portion 29 of which the width varies from 2.0 μm to 450 nm is provided between the core layer portion 30 and the front diffraction grating reflection mirror 27.

Figures 6A, 6B:
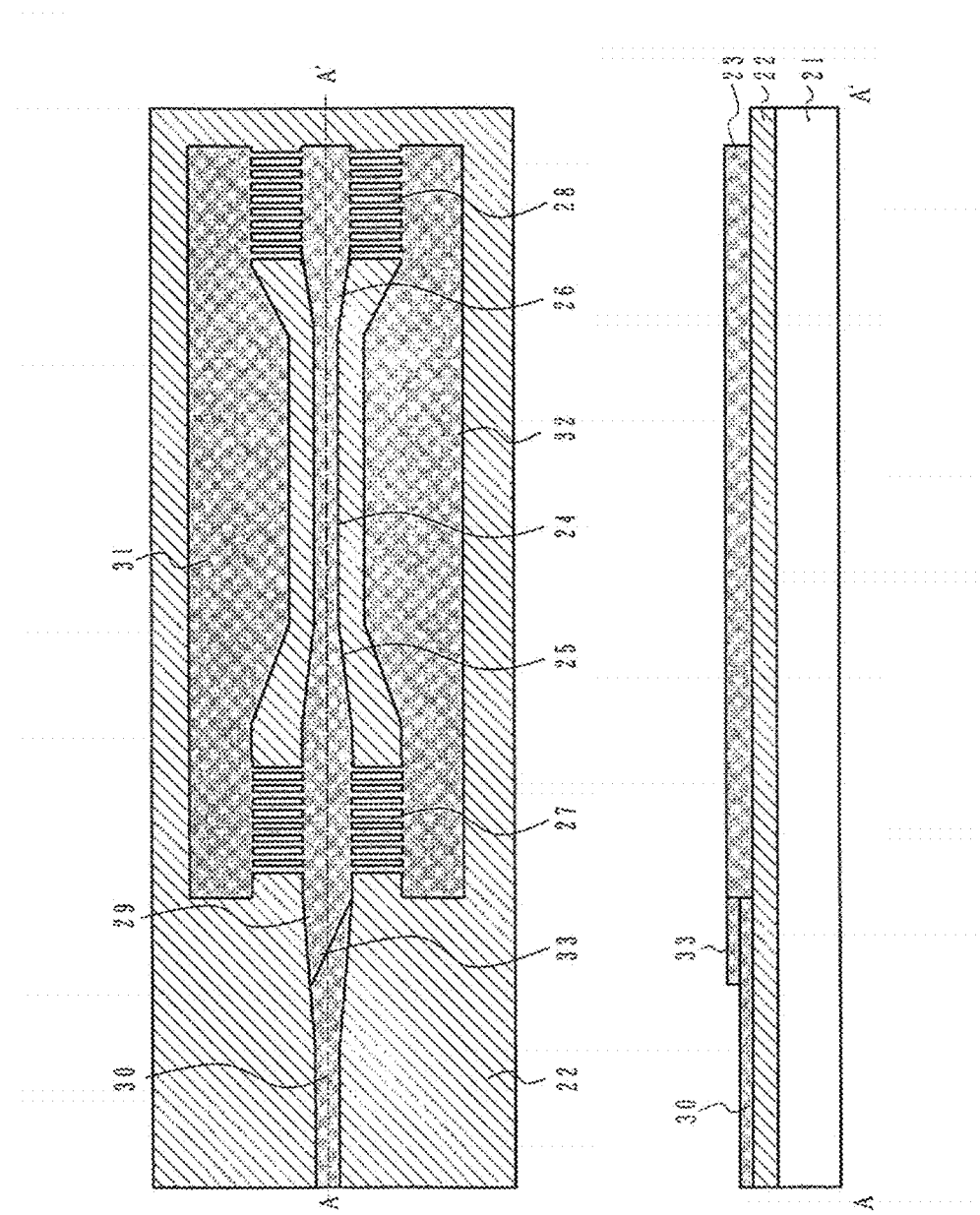
FIGS. 6A and 6B are diagrams illustrating the semiconductor light source according to Example 1 of the present invention in the middle of the manufacturing process after the state in FIGS. 5A and 5B.

Next, as illustrated in FIGS. 6A and 6B, the $SiO_2$ mask is removed and a new $SiO_2$ mask (not shown) is provided, and the core layer portion 30 for an optical wire waveguide is etched to a thickness of 220 nm. At the same time, the inversely tapered core layer portion 29 is provided with a diagonal step portion 33 that is inclined by approximately 10 degrees relative to the optical axis and of which the thickness varies in stepwise from 700 nm to 220 nm.

Next, as illustrated in FIGS. 7A and 7B, a resist pattern (not shown) is provided after the $SiO_2$ mask has been removed, and P ions are injected using this resist pattern as a mask so that n type semiconductor regions 34 are formed in the pedestals 31 and 32. The n type semiconductor regions 34 become current paths for the quantum dot semiconductor laser, and at the same time serves as regions on which n side electrodes are formed.

Next, as illustrated in FIGS. 8A and 8B, the quantum dot semiconductor laser 40 in FIG. 4 is first placed so that the n type $Al_{0.4}Ga_{0.6}As$ clad layer (46) makes contact with the optical waveguide and the pedestals 31 and 32 and then fused in accordance with a substrate bonding technology. At this time, the front diffraction grating reflection mirror 27 and the rear diffraction grating reflection mirror 28 do not overlap with the quantum dot semiconductor laser 40.

Next, as illustrated in FIGS. 9A and 9B, an $SiO_2$ film 35 that works as an upper clad layer is provided on the entire surface, and contact holes that reach the n type semiconductor regions 34 and the p type $Al_{0.4}Ga_{0.6}As$ clad layer (41) of the quantum dot semiconductor laser 40 are created in the $SiO_2$ film 35. Next, a p side electrode 36 and n side electrodes 37 are provided in such a manner that the contact holes are filled in with the electrodes, and thus, the basic structure of the semiconductor light source according to Example 1 of the present invention is complete.

In Example 1 of the present invention, such a tapered structure as in the above-described prior art is not used, and therefore, the problems with the requirements for high precision positioning and a highly precise process with a submicron unit for the quantum dot semiconductor laser are solved, which makes reduction in the cost possible. In addition, the use of a quantum dot semiconductor laser can improve the operation at a high temperature.

EXAMPLE 2

Figure 10:
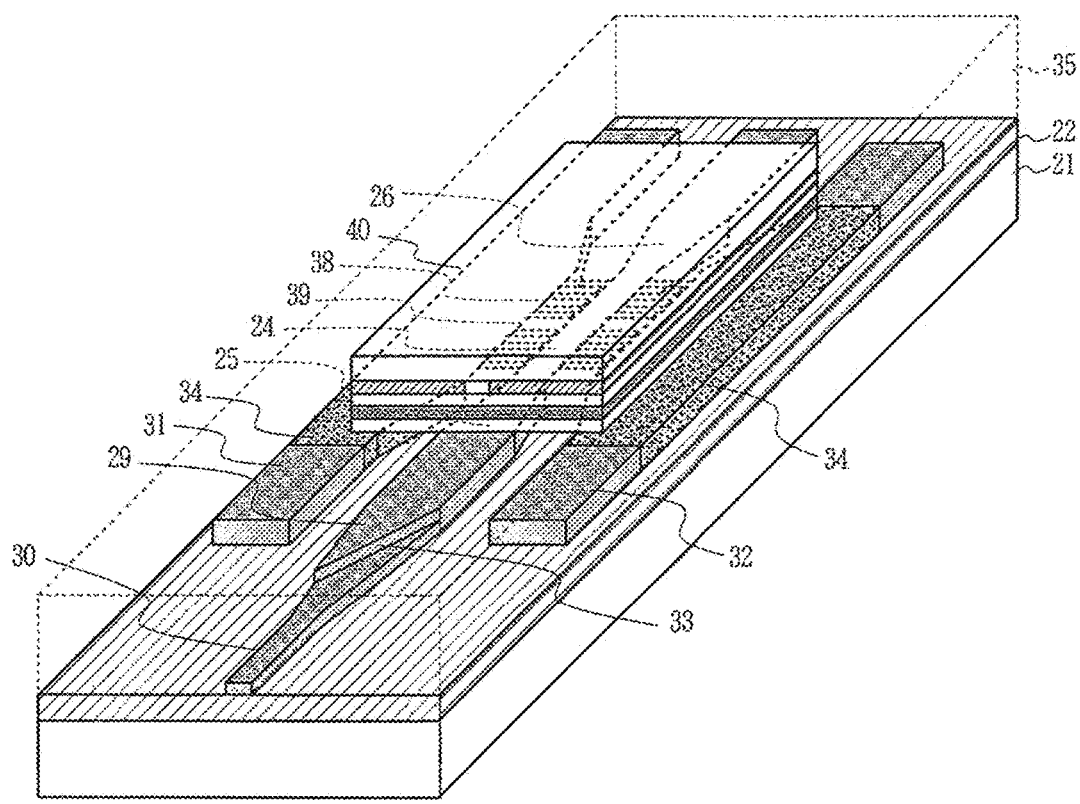
FIG. 10 is a schematic perspective diagram illustrating a semiconductor light source according to Example 2 of the present invention.
Figure 11:
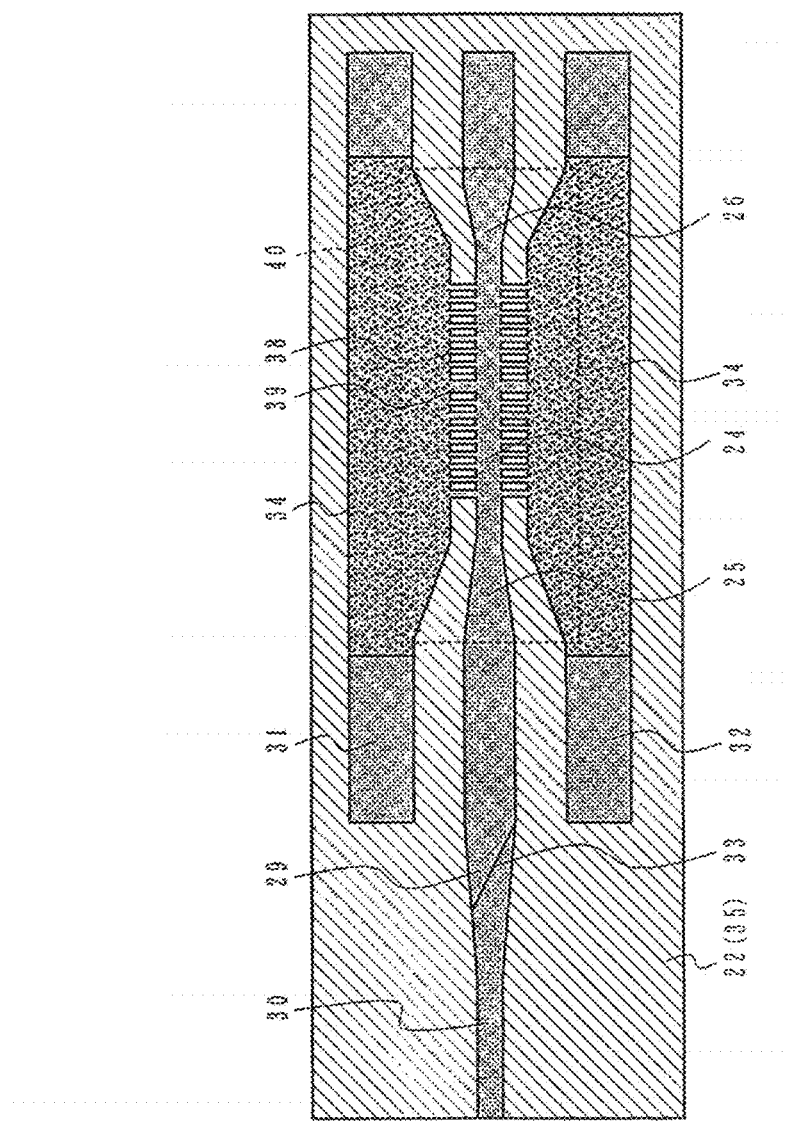
FIG. 11 is a schematic plan diagram illustrating the semiconductor light source according to Example 2 of the present invention.

Next, the semiconductor light source according to Example 2 of the present invention is described in reference to FIGS. 10 and 11. FIG. 10 is a schematic perspective diagram illustrating the semiconductor light source according to Example 2 of the present invention. FIG. 11 is a perspective plan diagram illustrating the structure of the side diffraction gratings in the semiconductor light source. Example 2 is the same as Example 1, except that side diffraction gratings that form a distributed feedback resonator are provided in Example 2 instead of the side diffraction gratings that become a Bragg reflection mirror type resonator in Example 1.

In the semiconductor light source in Example 2, side diffraction gratings are formed on the sides of a constant width core layer portion 24 that is close to the center portion and has a width of 0.9 μm so as to provide distributed feedback diffraction gratings 38. A phase shift region 39 where the phase shifts by ¼ of the oscillation wavelength λ is provided in a portion of the distributed feedback diffraction gratings 38. The distributed feedback diffraction gratings 38 make the quantum dot semiconductor laser 40 be a distributed feedback semiconductor laser.

In Example 2 of the present invention, no tapered structure is used like in Example 1, and therefore, the problems with the requirements for high precision positioning and a highly precise process with a submicron unit for the quantum dot semiconductor laser are solved, which makes reduction in the cost possible.

In addition, the resonator is provided with the phase shift region 39, and therefore, single wavelength oscillation becomes more certain even during a high temperature operation. It is also possible to inject a current into the quantum dot semiconductor laser 40 via the distributed feedback diffraction gratings 38, and therefore, the resistance of the element can be further reduced.

EXAMPLE 3

Figure 12:
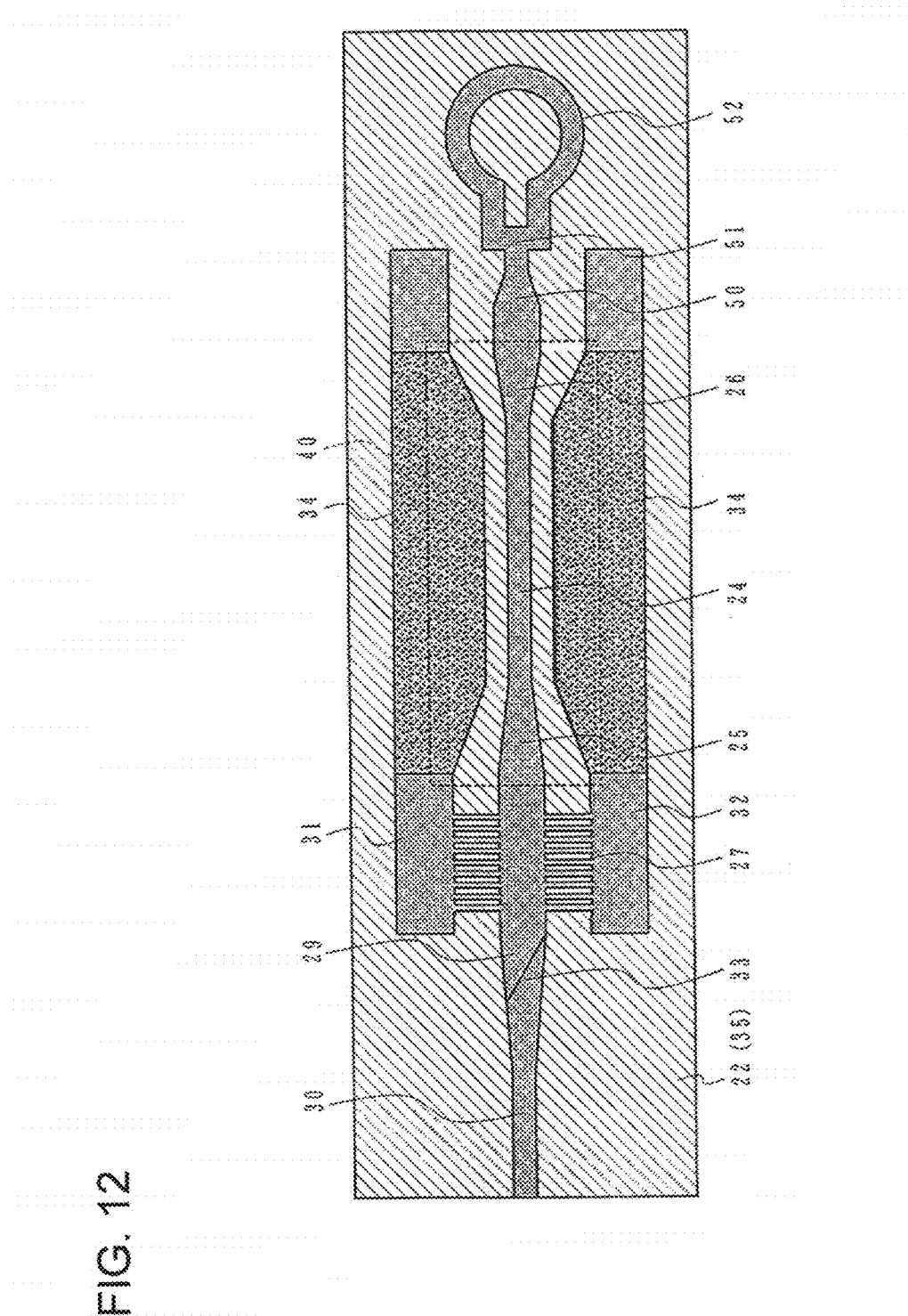
FIG. 12 is a schematic plan diagram illustrating a semiconductor light source according to Example 3 of the present invention.

Next, the semiconductor light source according to Example 3 of the present invention is described in reference to FIG. 12. Example 3 is the same as Example 1, except that the rear diffraction grating reflector in Example 1 is substituted with a loop mirror in Example 3. FIG. 12 is a schematic plan diagram illustrating the semiconductor light source according to Example 3 of the present invention. As illustrated in FIG. 12, a 1:2 branched core layer portion 51 and a loop mirror 52 connected thereto are provided as a rear reflection structure when an optical waveguide is formed by processing the single crystal Si layer (23). At this time, an inversely tapered core layer portion 50 is formed between the optical waveguide and the rear reflection structure. In this case, the light that has propagated to the rear side passes through the loop mirror 52 and returns to the gain region at the center with a reflectance of approximately 100%, excluding any excess loss.

In Example 3 of the present invention as well, no tapered structure is used like in Example 1, and therefore, the problems with the requirements for high precision positioning and a highly precise process with a submicron unit for the quantum dot semiconductor laser are solved, which makes reduction in the cost possible.

EXAMPLE 4

Figure 13:
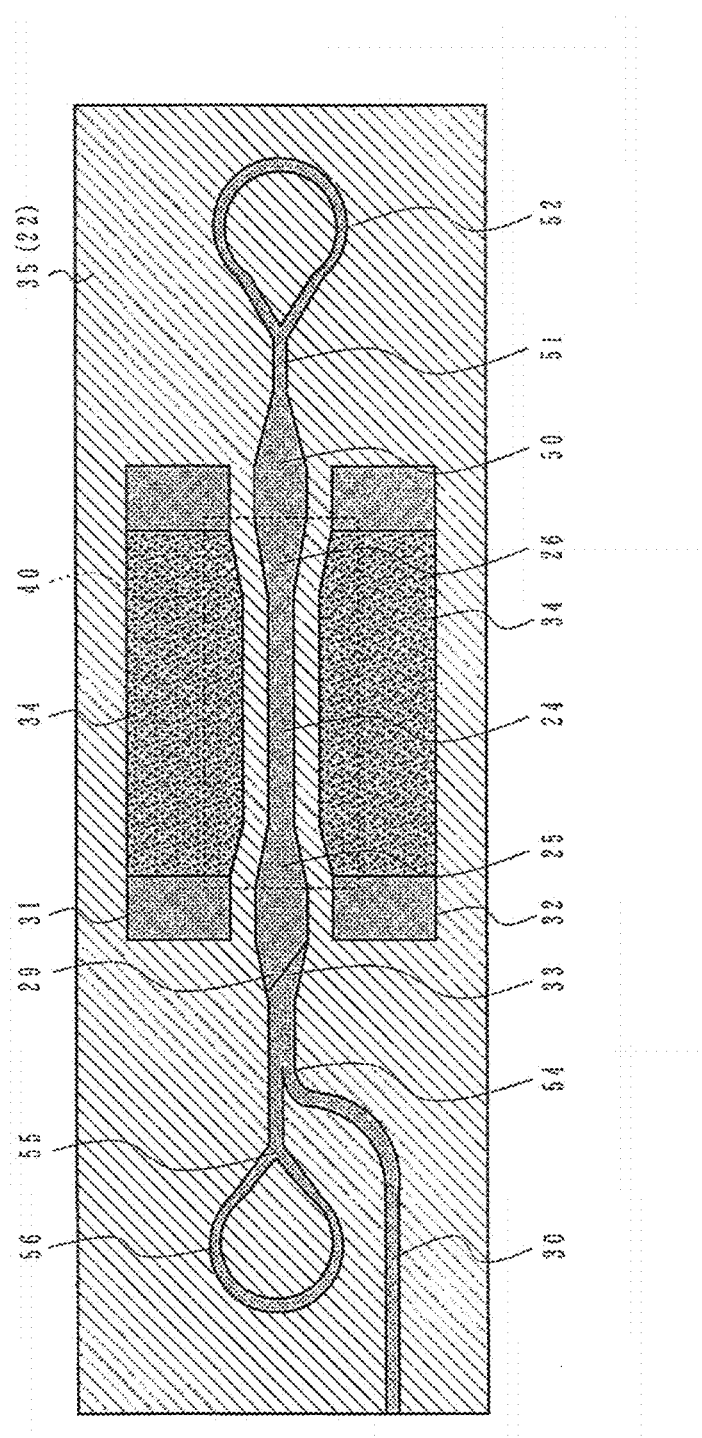
FIG. 13 is a schematic plan diagram illustrating a semiconductor light source according to Example 4 of the present invention.

Next, the semiconductor light source according to Example 4 of the present invention is described in reference to FIG. 13. Example 4 is the same as Example 1, except that the diffraction grating reflectors on both sides in Example 1 are substituted with loop mirrors in Example 4. FIG. 13 is a schematic perspective diagram illustrating the semiconductor light source according to Example 4 of the present invention. As illustrated in FIG. 13, a branched core layer portion 51 and a loop mirror 52 connected thereto are provided as a rear reflection structure when an optical waveguide is formed by processing the single crystal Si layer (23). At this time, an inversely tapered core layer portion 50 is formed between the optical waveguide and the rear reflection structure. At the same time, a branched core layer portion 55 and a loop mirror 56 connected thereto are provided as a front reflection structure. Between the optical waveguide and the front reflection structure, an inversely tapered core layer portion 29 is provided with a diagonal step portion 33, and a core layer portion 30 for an optical wire waveguide is branched from a branched core layer portion 54. In this case, excluding light that has been taken out as the light output, the light that has propagated to the front side and to the rear side passes through the loop mirrors 52 and 56, and returns to the gain region at the center with a reflectance of approximately 100%, excluding any excess loss.

In Example 4 of the present invention as well, no tapered structure is used like in Example 1, and therefore, the problems with the requirements for high precision positioning and a highly precise process with a submicron unit for the quantum dot semiconductor laser are solved, which makes reduction in the cost possible.

EXAMPLE 5

Figures 14A, 14B:
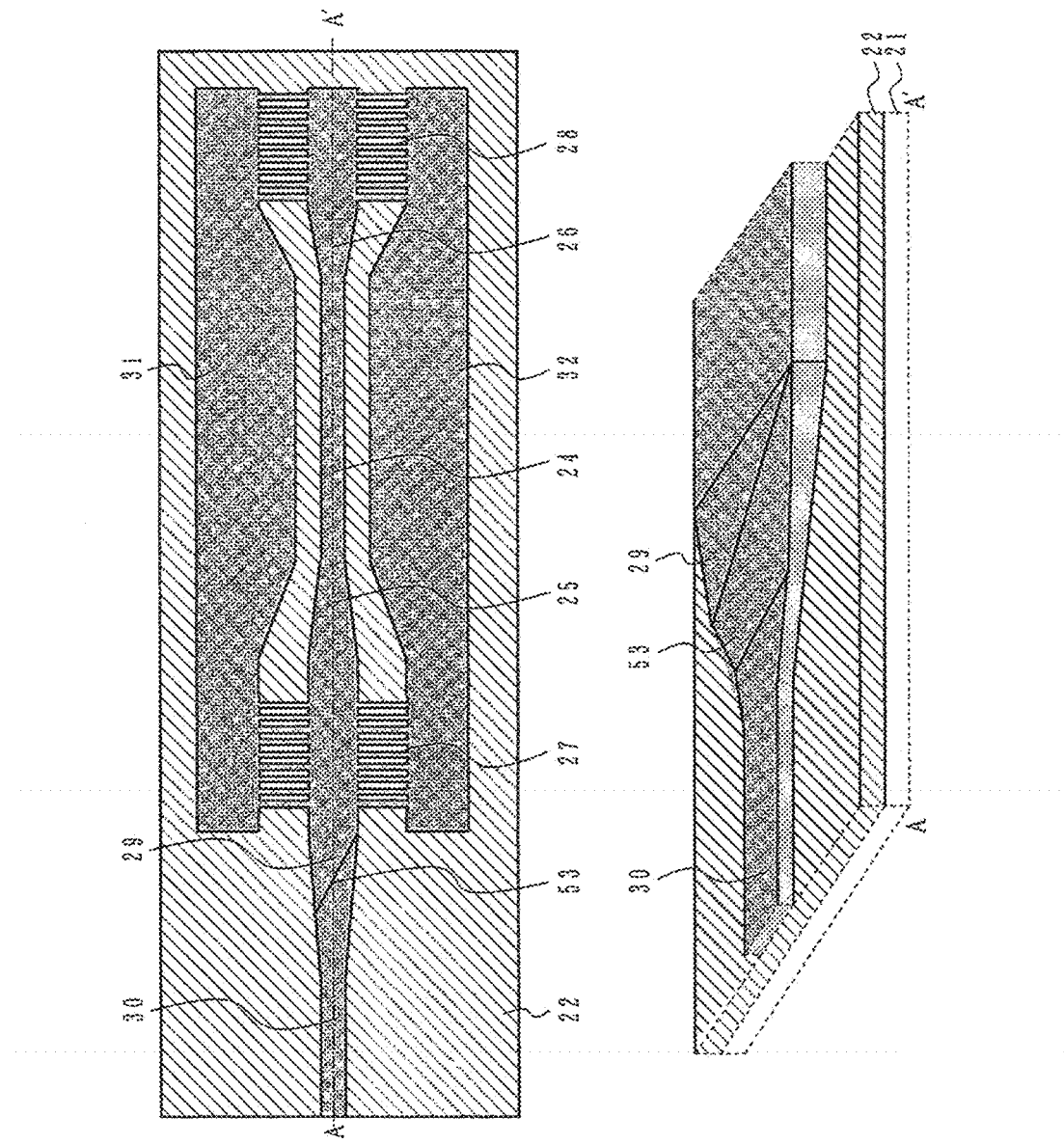
FIGS. 14A and 14B are diagrams illustrating a semiconductor light source according to Example 5 of the present invention.

Next, the semiconductor light source according to Example 5 of the present invention is described in reference to FIGS. 14A and 14B. Example 5 is the same as Example 1, except that the film thickness varies in the diagonal step portion gradually in Example 5 instead of step by step as in Example 1. FIGS. 14A and 14B are diagrams illustrating only the structure of the optical waveguide in the semiconductor light source according to Example 5 of the present invention. FIG. 14A is a schematic plan diagram, and FIG. 14B is a perspective diagram illustrating an enlargement in the vicinity of the diagonal step portion.

In Example 5 of the present invention as well, an inversely tapered core layer portion 29 of which the width varies from 2.0 μm to 450 nm is provided between the core layer portion 30 for an optical wire waveguide and the front diffraction grating reflection mirror 27. At this time, a diagonal step portion 53 that has a graded incline of approximately 10 degrees relative to the optical axis and of which the thickness gradually reduces from 700 nm to 220 nm is formed in the inversely tapered core layer portion 29.

In Example 5 of the present invention, the film thickness varies in a graded manner in the diagonal step portion 53, and therefore, light reflection can be further reduced when the guided light transits from the core layer portion having a thickness of 700 nm to the core layer portion 30 for an optical wire waveguide having a thickness of 220 nm.

EXAMPLE 6

Figure 15:
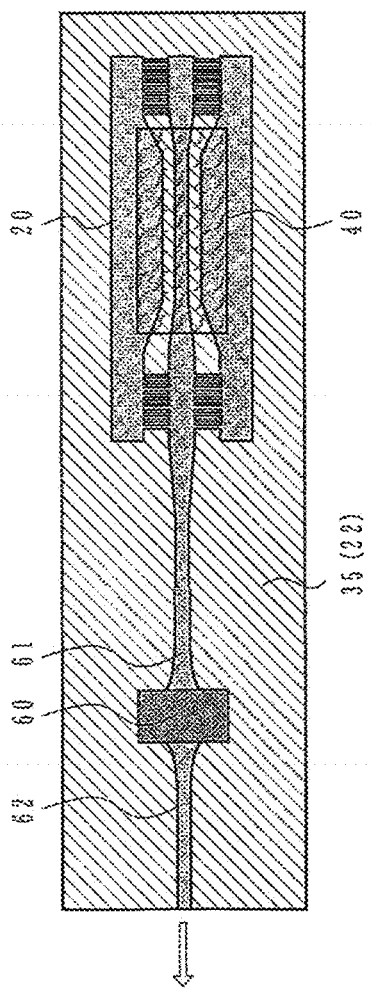
FIG. 15 is a schematic plan diagram illustrating an optical transmitter according to Example 6 of the present invention.

Next, the light transmitter according to Example 6 of the present invention is described in reference to FIG. 15. FIG. 15 is a schematic plan diagram illustrating the light transmitter according to Example 6 of the present invention, which is obtained by providing an electrical field absorption type optical modulator 60 on the light output side of the same semiconductor light source 20 as that in Example 1.

When an optical waveguide pattern is formed by processing the single crystal Si layer on the SOI substrate, a core layer portion 61 for an input waveguide, a core layer portion 62 for output, and a terrace portion between the core layer portions 61 and 62 are formed. A p type Ge layer, an i type Ge layer and an n type Ge layer are sequentially deposited on this terrace portion through selective growth, and then, a p side electrode is provided to the p type Ge layer and an n side electrode is provided to the n type Ge layer so that an electrical field absorption type optical modulator 60 is formed.

Though the figure illustrates one combination of the semiconductor light source 20 and the electrical field absorption type optical modulator 60, a number of combinations may be arranged in parallel so as to provide a light transmitter for multiplex communication. In this case, the pitch and the width of the side diffraction gratings are varied so as to handle different wavelengths. Though not shown, an optical multiplexer may be integrally formed by using the single crystal Si layer.

In Example 6 of the present invention as well, no tapered structure is used like in Example 1 in order to form a semiconductor light source, and therefore, a high performance light transmitter can be realized at a low cost. Though an electrical field absorption type optical modulator is used as an optical modulator in Example 6, a side diffraction grating type optical modulator may be used.

EXAMPLE 7

Figure 16:
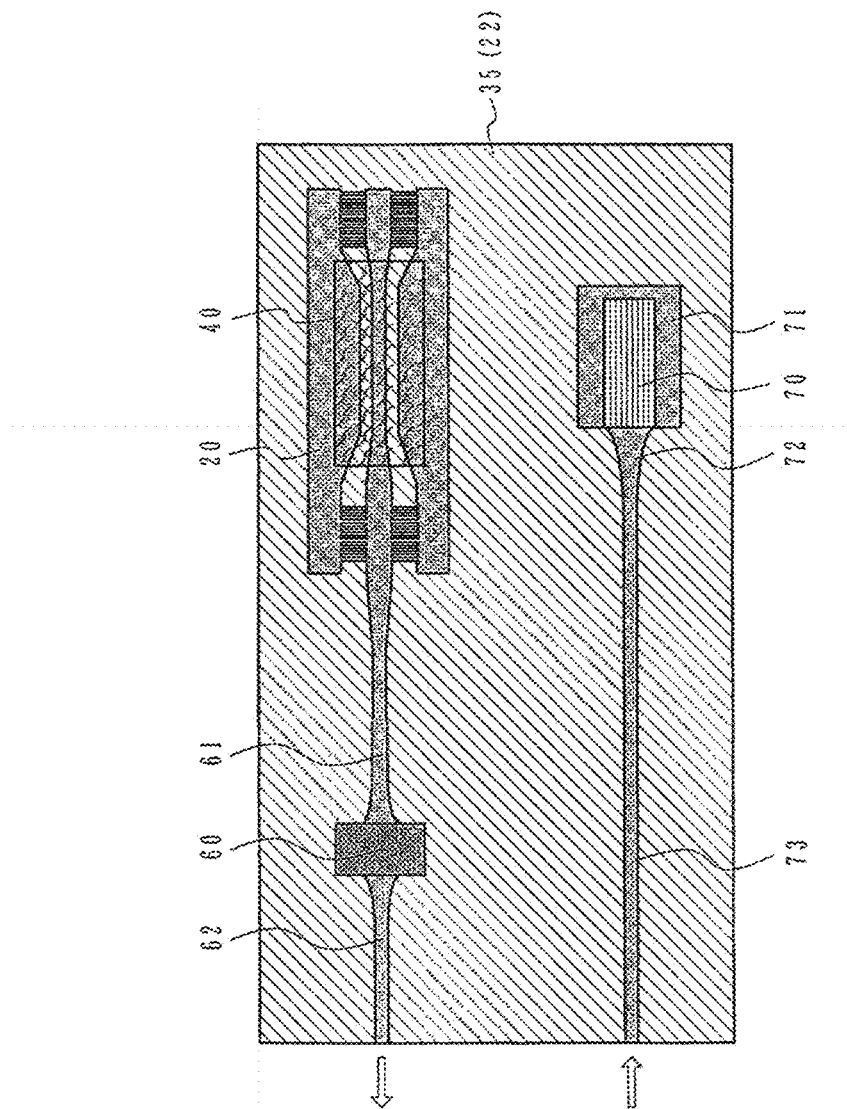
FIG. 16 is a schematic plan diagram illustrating an optical transceiver according to Example 7 of the present invention.

Next, the optical transceiver according to Example 7 of the present invention is described in reference to FIG. 16. FIG. 16 is a schematic plan diagram illustrating the optical transceiver according to Example 7 of the present invention. The optical transceiver is obtained by providing a Ge photodiode to the same light transmitter as that in Example 6.

When an optical waveguide pattern is formed by processing a single crystal Si layer on an SOI substrate, a core layer portion 61 for an input waveguide, a core layer portion 62 for an output waveguide, and a terrace portion between the core layer portions 61 and 62 are formed, and at the same time, a terrace portion 71, a tapered core layer portion 72 and a core layer portion 73 for an optical wire waveguide are formed parallel to the core layer portions 61 and 62 and the terrace portion between the core layer portions 61 and 62. A p type Ge layer, an i type Ge layer and an n type Ge layer are sequentially deposited on the terrace portion between the core layer portions 61 and 62 through selective growth, and a p side electrode is provided to the p type Ge layer and an n side electrode is provided to the n type Ge layer so as to form an electrical field absorption type optical modulator 60. In addition, a p type Ge layer, an i type Ge layer and an n type Ge layer are sequentially deposited on the terrace portion 71 through selective growth, and a p side electrode is provided to the p type Ge layer and an n side electrode is provided to the n type Ge layer so as to form a Ge photodiode 70.

Though the figure illustrates one combination of the semiconductor light source 20, the electrical field absorption type optical modulator 60 and the Ge photodiode, a number of combinations may be arranged in parallel so as to provide an optical transceiver for multiplex communication. In this case as well, the pitch and the width of the side diffraction gratings are varied so as to handle different wavelengths. Though not shown, an optical multiplexer may be integrally formed on the output end side of the electrical field absorption type optical modulator by using the single crystal Si layer so that an optical demultiplexer can be formed integrally on the output end side of the core layer portion 73 for an optical wire waveguide.

In Example 7 of the present invention as well, no tapered structure is used like in Example 1 in order to form a semiconductor light source, and therefore, a high performance optical transceiver can be realized at a low cost. Though an electrical field absorption type optical modulator is used as an optical modulator in Example 7, a side diffraction grating type optical modulator may be used.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor light source, comprising:
a substrate;
an optical waveguide having a reflection structure provided on the substrate with an oxide film between the optical waveguide and the substrate; and
a semiconductor light emitting element provided on the optical waveguide, wherein
the optical waveguide comprises: a constant width core layer portion located in a center portion; tapered core layer portions that are provided on either side of the constant width core layer and of which the core width gradually increases; and a constant width core layer portion for an optical wire waveguide, and
the semiconductor light emitting element is placed so as to cover at least a portion of the tapered core layer portions on both sides.

2. The semiconductor light source according to claim 1, wherein the reflection structure is a side diffraction grating formed in a region that is not covered by the semiconductor light emitting element.

3. The semiconductor light source according to claim 1, wherein the reflection structure is a side diffraction grating provided on a side of the constant width core layer portion located in the center portion.

4. The semiconductor light source according to claim 1, wherein the reflection structure comprises: a side diffraction grating provided only in a region that is not covered by the semiconductor light emitting element on the emission side; and a loop mirror provided in a region that is not covered by the semiconductor light emitting element on the side opposite the emission side.

5. The semiconductor light source according to claim 1, wherein the reflection structure comprises a pair of loop mirrors, each of which is provided at either end of the optical waveguide, and the constant width core layer portion for an optical wire waveguide is branched from an input waveguide for the loop mirror on the emission end side of the optical waveguide.

6. The semiconductor light source according to claim 1, wherein an inversely tapered core layer portion of which the taper width gradually decreases toward the core layer portion for an optical wire waveguide is provided between the core layer portion for an optical wire waveguide and the tapered core layer portion on the emission side, and the inversely tapered core layer portion is provided with a transition portion of which the thickness varies.

7. The semiconductor light source according to claim 6, wherein the film thickness of the transition portion varies in stepwise in the direction that is diagonal to a guided wave direction.

8. The semiconductor light source according to claim 6, wherein the film thickness of the transition portion gradually decreases in the direction that is diagonal to a guided wave direction.

9. The semiconductor light source according to claim 1, further comprising a pedestal on which the semiconductor light emitting element is mounted on each side of at least a portion of the optical waveguide.

10. The semiconductor light source according to claim 1, wherein the substrate is an Si substrate in an SOI substrate where a single crystal Si layer is provided on the Si substrate with a buried oxide film between the optical waveguide and the substrate, the oxide film is the buried oxide film in the SOI substrate, and the optical waveguide and the side diffraction grating are formed by processing the single crystal Si layer in the SOI substrate.

11. The semiconductor light source according to claim 1, wherein the semiconductor light emitting element is a quantum dot semiconductor laser comprising a quantum dot active layer.

12. A light transmitter, characterized in that an optical modulator and a core layer portion for an input waveguide that connects a core layer portion for an optical wire waveguide to the optical modulator on a substrate on which the same semiconductor light source as that according to claim 1 is provided.

13. An optical transceiver, characterized by being provided on a substrate on which the same light transmitter as that according to claim 12 is provided, with: an optical wire waveguide core layer portion for input; and a Ge-based light receiving element that is optically coupled to the optical wire waveguide core layer for input and that is made of Ge or of which a major component is Ge.

* * * * *